(12) United States Patent
Tan

(10) Patent No.: US 7,262,678 B2
(45) Date of Patent: Aug. 28, 2007

(54) MAGNET SYSTEM AND MRI SYSTEM

(75) Inventor: Fengshun Tan, Wuxi (CN)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/368,926

(22) Filed: Mar. 6, 2006

(65) Prior Publication Data

US 2006/0202788 A1   Sep. 14, 2006

(30) Foreign Application Priority Data

Mar. 9, 2005   (CN) .................... 2005 1 00550939

(51) Int. Cl.
*H01F 7/02* (2006.01)
(52) U.S. Cl. .................. 335/306; 335/302; 335/296
(58) Field of Classification Search ........ 335/302–306, 335/296–299
See application file for complete search history.

(56) References Cited

U.S. PATENT DOCUMENTS

| | | | | |
|---|---|---|---|---|
| 4,672,346 A * | 6/1987 | Miyamoto et al. | .......... | 335/296 |
| 5,134,374 A * | 7/1992 | Breneman et al. | .......... | 324/319 |
| 5,194,810 A * | 3/1993 | Breneman et al. | .......... | 324/319 |
| 5,463,364 A | 10/1995 | Muller | | |
| 5,471,140 A | 11/1995 | Hanley | | |
| 5,557,205 A | 9/1996 | Ohta et al. | | |
| 5,942,962 A | 8/1999 | Gery | | |
| 6,147,495 A * | 11/2000 | DeMeester et al. | ......... | 324/320 |
| 6,340,888 B1 * | 1/2002 | Aoki et al. | .................. | 324/319 |
| 6,411,187 B1 | 6/2002 | Rotem et al. | | |
| 6,507,193 B2 | 1/2003 | Benz et al. | | |
| 6,518,867 B2 * | 2/2003 | Laskaris et al. | ............ | 335/299 |
| 6,670,877 B2 * | 12/2003 | Rapoport | .................... | 335/296 |
| 6,825,668 B2 * | 11/2004 | Watanabe | .................... | 324/320 |
| 6,842,002 B2 * | 1/2005 | Cheng et al. | ............... | 324/318 |
| 6,889,422 B2 | 5/2005 | Doi | | |
| 6,924,722 B2 | 8/2005 | Doi et al. | | |
| 7,019,609 B2 * | 3/2006 | Huang et al. | ............... | 335/296 |
| 7,023,309 B2 * | 4/2006 | Laskaris et al. | ............ | 335/306 |
| 7,071,694 B1 * | 7/2006 | Kruip | .......................... | 324/323 |
| 2005/0052266 A1 * | 3/2005 | Doi | ............................. | 335/302 |

FOREIGN PATENT DOCUMENTS

JP    2002-369807    12/2002

* cited by examiner

*Primary Examiner*—Elvin Enad
*Assistant Examiner*—Mohamad A Musleh
(74) *Attorney, Agent, or Firm*—Armstrong Teasdale LLP

(57) ABSTRACT

With a view to providing a magnet apparatus which can form a medium magnetic field with use of permanent magnets, the magnet apparatus having a pair of parallel disc-like permanent magnets with magnetic poles of mutually opposite polarities opposed to each other through a spacing, further comprises: two pairs of rings constituted by permanent magnets and provided respectively on pole faces of the pair of permanent magnets coaxially and doubly, the two pairs of rings each having a magnetizing direction inclined relative to a magnetizing direction of the pair of permanent magnets and having magnetic poles of mutually opposite polarities opposed to each other through a spacing; and two pairs of cylinders formed by a ferromagnetic material and partitioning the interiors of the pair of permanent magnets respectively coaxially and doubly.

10 Claims, 6 Drawing Sheets

MAGNET SYSTEM AND MRI SYSTEM

CROSS REFERENCE TO RELATED APPLICATIONS

This application claims the benefit of Chinese Application No. 200510055093.9 filed Mar. 9, 2005.

BACKGROUND OF THE INVENTION

The present invention relates to a magnet apparatus and an MRI (Magnetic Resonance Imaging) apparatus. Particularly, the present invention is concerned with a magnet apparatus using permanent magnets and an MRI apparatus which re-constructs an image on the basis of a magnetic resonance signal picked up through the magnet apparatus.

The MRI apparatus is constructed so as to re-construct an image on the basis of a magnetic resonance signal picked up through a magnet apparatus. A certain magnet apparatus uses a pair of parallel disc-like permanent magnets with magnetic poles of mutually opposite polarities opposed to each other through a spacing (see, for example, Patent Literature 1).

[Patent Literature 1]

Japanese Patent Laid Open No. 2002-369807 (p. 5-6, FIGS. 1 to 7)

The magnet apparatus of this type is suitable for the formation of a low magnetic field up to about 0.3T, but is not suitable for the formation of a medium magnetic field larger in field strength.

SUMMARY OF THE INVENTION

Therefore, it is an object of the present invention to provide a magnet apparatus which can form a medium magnetic field with use of permanent magnets, as well as an MRI apparatus having such a magnet apparatus.

In one aspect of the present invention for solving the above-mentioned problem there is provided a magnet apparatus having a pair of parallel disc-like permanent magnets with magnetic poles of mutually opposite polarities opposed to each other through a spacing, comprising: two pairs of rings constituted by permanent magnets and provided respectively on pole faces of the pair of permanent magnets coaxially and doubly, the two pairs of rings each having a magnetizing direction inclined relative to a magnetizing direction of the pair of permanent magnets and having magnetic poles of mutually opposite polarities opposed to each other through a spacing; and two pairs of cylinders formed by a ferromagnetic material and partitioning the interiors of the pair of permanent magnets respectively coaxially and doubly.

In another aspect of the present invention for solving the above-mentioned problem there is provided an MRI apparatus which re-constructs an image on the basis of a magnetic resonance signal picked up through a magnet apparatus, the magnet apparatus having a pair of parallel disc-like permanent magnets with magnetic poles of mutually opposite polarities opposed to each other through a spacing and also having a gradient magnetic field coil and an RF coil, characterized in that the magnet apparatus comprises: two pairs of rings constituted by permanent magnets and provided respectively on pole faces of the pair of permanent magnets coaxially and doubly, the two pairs of rings each having a magnetizing direction inclined relative to a magnetizing direction of the pair of permanent magnets and having magnetic poles of mutually opposite polarities opposed to each other through a spacing; and two pairs of cylinders formed by a ferromagnetic material and partitioning the interiors of the pair of permanent magnets respectively coaxially and doubly.

For enhancing the field strength and improving the uniformity of magnetic field it is preferable that the inclination of the magnetizing direction of each of the two pairs of rings be an inclination which causes a magnetic flux to project in a direction away from a central axis.

For enhancing the field strength and improving the uniformity of magnetic field it is preferable for the two pairs of rings to be opposed to each other in such a manner that the rings positioned outside are spaced shorter than the rings positioned inside.

For improving the uniformity of magnetic field and enhancing the mechanical strength of the permanent magnet portions it is preferable for the two pairs of cylinders to be formed in such a manner that the cylinders positioned outside are thicker than the cylinders positioned inside.

For attaining a well-balanced state between field strength and uniformity it is preferable for the two pairs of rings to be formed in such a manner that the rings positioned inside are larger in inside diameter than the diameter of a photographing area and for the two pairs of cylinders to be formed in such a manner that the cylinders positioned outside are smaller in outside diameter than the diameter of the photographing area.

The magnetic apparatus according to the present invention is a magnet apparatus having a pair of parallel disc-like permanent magnets with magnetic poles of mutually opposite polarities opposed to each other through a spacing. The magnet apparatus comprises: two pairs of rings constituted by permanent magnets and provided respectively on pole faces of the pair of permanent magnets coaxially and doubly, the two pairs of rings each having a magnetizing direction inclined relative to a magnetizing direction of the pair of permanent magnets and having magnetic poles of mutually opposite polarities opposed to each other through a spacing; and two pairs of cylinders formed by a ferromagnetic material and partitioning the interiors of the pair of permanent magnets respectively coaxially and doubly. Consequently, it is possible to provide a magnet apparatus which can form a medium magnetic field with use of permanent magnets and an MRI apparatus using such a magnet apparatus.

Further objects and advantages of the present invention will be apparent from the following description of the preferred embodiments of the invention as illustrated in the accompanying drawings.

DETAILED DESCRIPTION OF THE INVENTION

Figure 1:
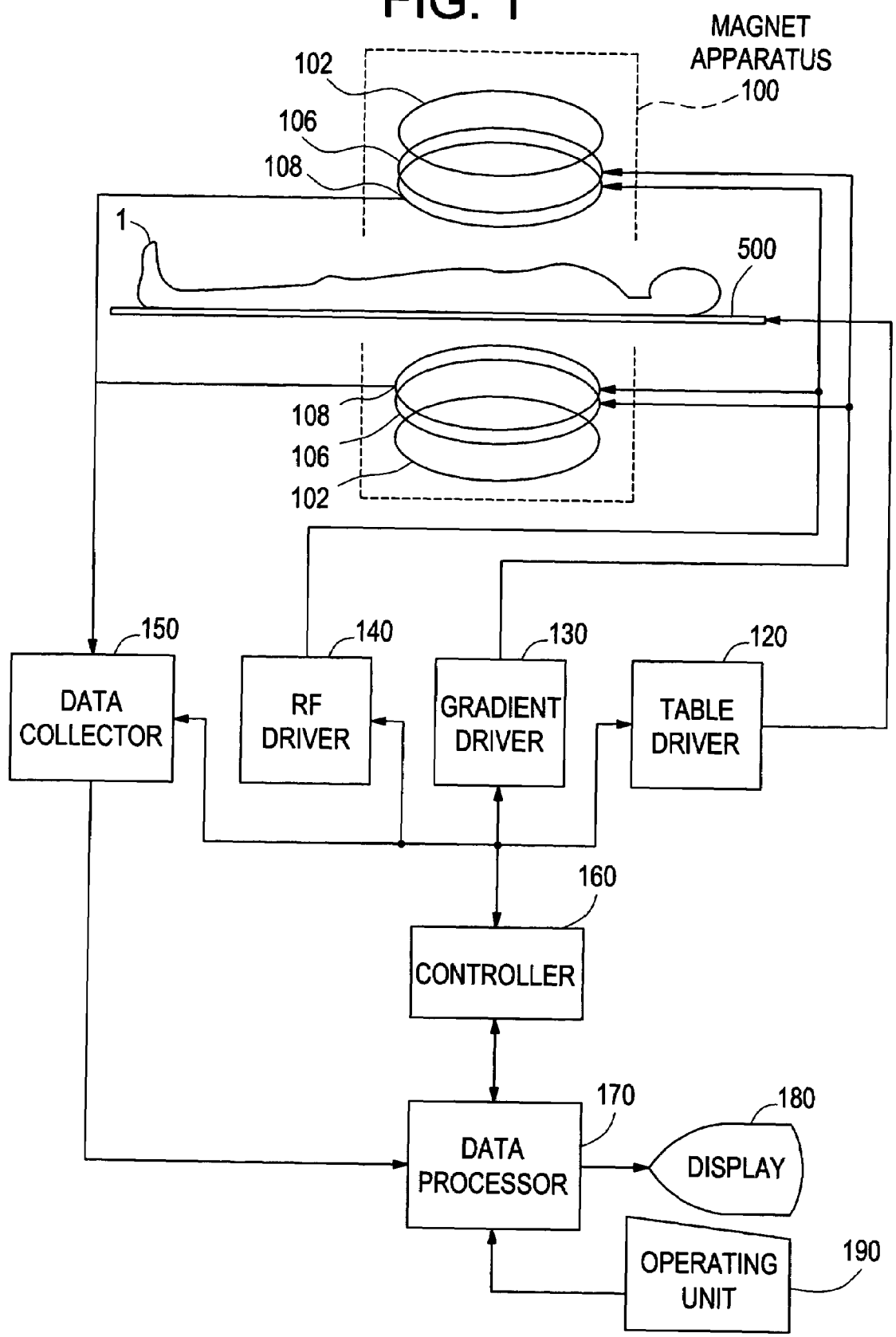
FIG. 1 is a block diagram of an MRI apparatus as an example of the best mode for practicing the present invention.

The best mode for practicing the present invention will be described in detail hereinunder with reference to the drawings. The present invention is not limited to the following best mode. FIG. 1 is a block diagram of an MRI apparatus according to the present invention. This apparatus is an example of the best mode. With the construction of this apparatus there is shown an example of the best As shown in the same figure, this apparatus has a magnet apparatus 100. The magnet apparatus 100 includes a main field magnet portion 102, a gradient coil portion 106 and an RF (radio frequency) coil portion 108.

The main magnet portion 102, the gradient coil portion 106 and the RF coil portion 108 are each constituted in a pair of portions opposed to each other through a spacing and are each formed in a generally disc shape, having a central axis in common.

The magnet apparatus 100 is an example of the best mode for practicing the present invention. With the construction of the magnet apparatus there is shown an example of the best mode for practicing the present invention with respect to the magnet apparatus. Further, the magnet apparatus 100 is an example of the magnet apparatus in the present invention. As to the magnet apparatus 100, a description will be given again later.

An object 1 is carried into and out of an internal bore of the magnet apparatus 100 while being placed on a table 500. The table 500 is actuated by a table driver 120.

The main field magnet portions 102 each form a static magnetic field in the internal bore of the magnet apparatus 100. The direction of the static magnetic field is substantially orthogonal to a body axis direction of the object 1. That is, a so-called vertical magnetic field is formed. The main field magnet portions 102 are constituted using permanent magnets. As to the main field magnet portion 102, a description will be given again later.

The gradient coil portions 106 each generate three gradient magnetic fields in order to impart gradient to the static field strength in each of the directions of three axes perpendicular to one another, i.e., slice axis, phase axis, and frequency axis. The gradient coil portions 106 are each provided with three systems of gradient coils (not shown) correspondingly to the three gradient magnetic fields.

The RF coil portions 108 transmits an RF pulse (radio frequency pulse) for exciting an internal spin of the object 1 in the static field space. The RF coil portions 108 each receive a magnetic resonance signal which the excited spin generates. It is optional whether the RF coil portions 108 are of the type in which transmission and reception are performed using the same coil or of the type in which transmission and reception are performed using separate coils.

A gradient driver 130 is connected to the gradient coil portions 106. The gradient driver 130 provides a drive signal to each of the gradient coil portions 106 to generate a gradient magnetic field. The gradient driver 130 has three systems of drive circuits (not shown) correspondingly to three systems of gradient coils in each gradient coil portion 106.

An RF driver 140 is connected to the RF coil portions 108. The RF driver 140 provides a drive signal to each of the RF coil portions 108 to excite an internal spin of the object 1.

A data collector 150 is connected to the RF coil portions 108. The data collector 108 samples signals which the RF coil portions 108 have received, and collects them as digital data.

A controller 160 is connected to all of the data driver 120, gradient driver 130, RF driver 140 and data collector 150. The controller 160 controls the drivers 120, 130, 140 and the data collector 150 to execute photographing.

The controller 160 is constituted using a computer for example. The controller 160 includes memory. The memory stores programs and various data for the controller 160. The function of the controller 160 is implemented by execution with the computer of the programs stored in the memory.

An output side of the data collector 150 is connected to a data processor 170. The data collected by the data collector 150 are inputted to the data processor 170. The data processor 170 is constituted using a computer for example. The data processor 170 includes memory. The memory stores programs and various data for the data processor 170.

The data processor 170 is connected to the controller 160. The data processor 170 ranks higher than and controls the controller 160. The function of this system is implemented by execution with the data processor 170 of the programs stored in the memory.

The data processor 170 stores in memory the data collected by the data collector 150. A data space is formed within the memory. The data space constitutes a Fourier space. The Fourier space is also called k-space. The data processor 170 re-constructs an image of the object 1 by inverse Fourier transform of the data in the k-space.

A display 180 and an operating unit 190 are connected to the data processor 170. The display 180 is constituted by a graphic display for example. The operating unit 190 is constituted, for example, by a keyboard provided with a pointing device.

The display 180 displays the re-constructed image and various information pieces outputted from the data processor 170. The operating unit 190, which is operated by a user, causes various commands and information pieces to be inputted to the data processor 170. The user can operate this system interactively through the display 180 and the operating unit 190.

Figure 2:
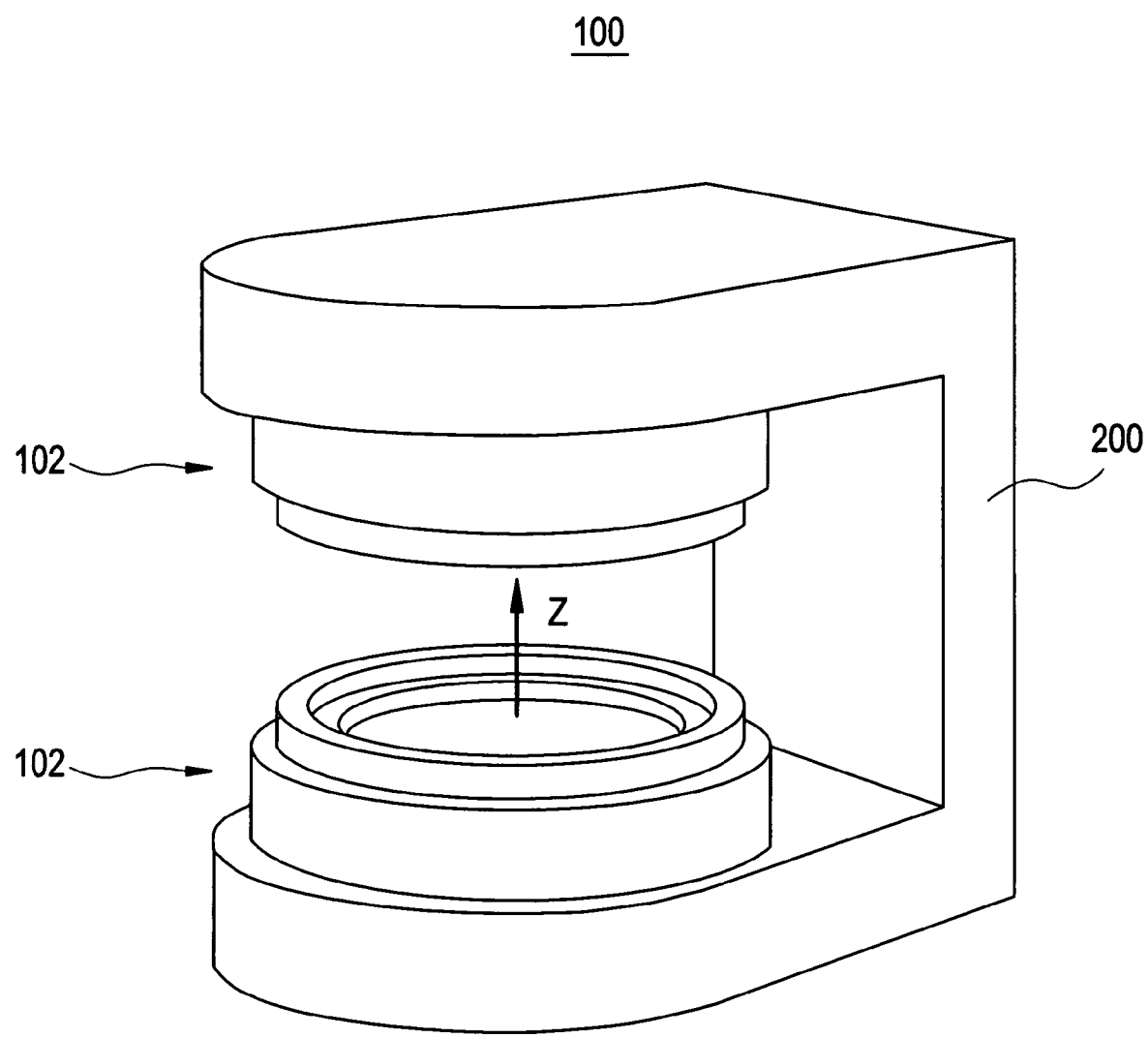
FIG. 2 is a perspective view showing the appearance of a magnet apparatus.

Description is now directed to the magnet apparatus 100. The appearance of an example of the magnet apparatus 100 is shown by a perspective view of FIG. 2. As shown in the same figure, the magnet apparatus 100 comprises a pair of static field magnet portions 102 supported by a yoke 200.

The static field magnet portions 102 have a generally disc- or short column-like profile. The yoke 200 forms a return magnetic path for the pair of static field magnet portions 102. For example, the yoke 200 is formed in a generally C shape using a ferromagnetic material such as soft iron. The shape of the yoke 200 is not limited to C shape.

The pair of static field magnet portions 102 are supported in parallel and coaxially so that magnetic poles of mutually opposite polarities are opposed to each other through a predetermined spacing, whereby a vertical magnetic field is formed between both magnetic poles. The direction of the magnetic field is here designated z direction. The pair of gradient coil portions 106 and the pair of RF coil portions are provided on pole faces of the pair of static field magnet portions 102, though not shown.

Figure 3:
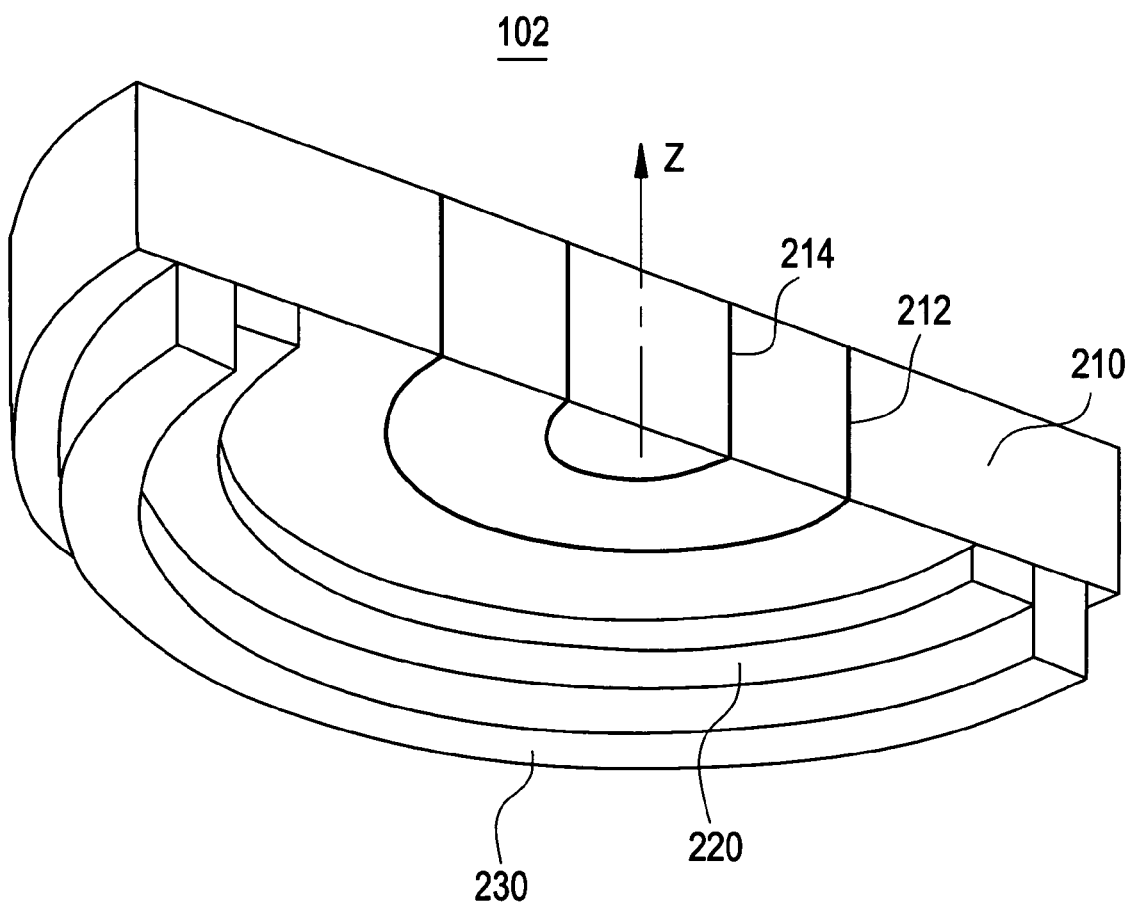
FIG. 3 is a perspective view showing the structure of a main field magnet.

FIG. 3 shows a detailed construction of a static field magnet portion 102. In the same figure, one of the paired static field magnet portions 102 is shown in a cut state along the diameter thereof. As shown in the same figure, the static field magnet portion 102 has a disc- or short column-like permanent magnet 210. The interior of the permanent magnet 210 is partitioned coaxially by two cylinders 212 and 214. The cylinders 212 and 214 are constituted using a ferromagnetic material such as soft iron for example. The cylinders 212 and 214 are an example of the cylinder defined in the present invention.

The permanent magnet 210 has two coaxial rings 220 and 230 on a pole face on the side opposite to the contact side with the yoke 200. The two rings 220 and 230 constitute double rings with the ring 220 inscribed to the ring 230. Both rings 220 and 230 are formed by permanent magnets. The rings 220 and 230 are an example of the rings defined in the present invention.

Figure 4:
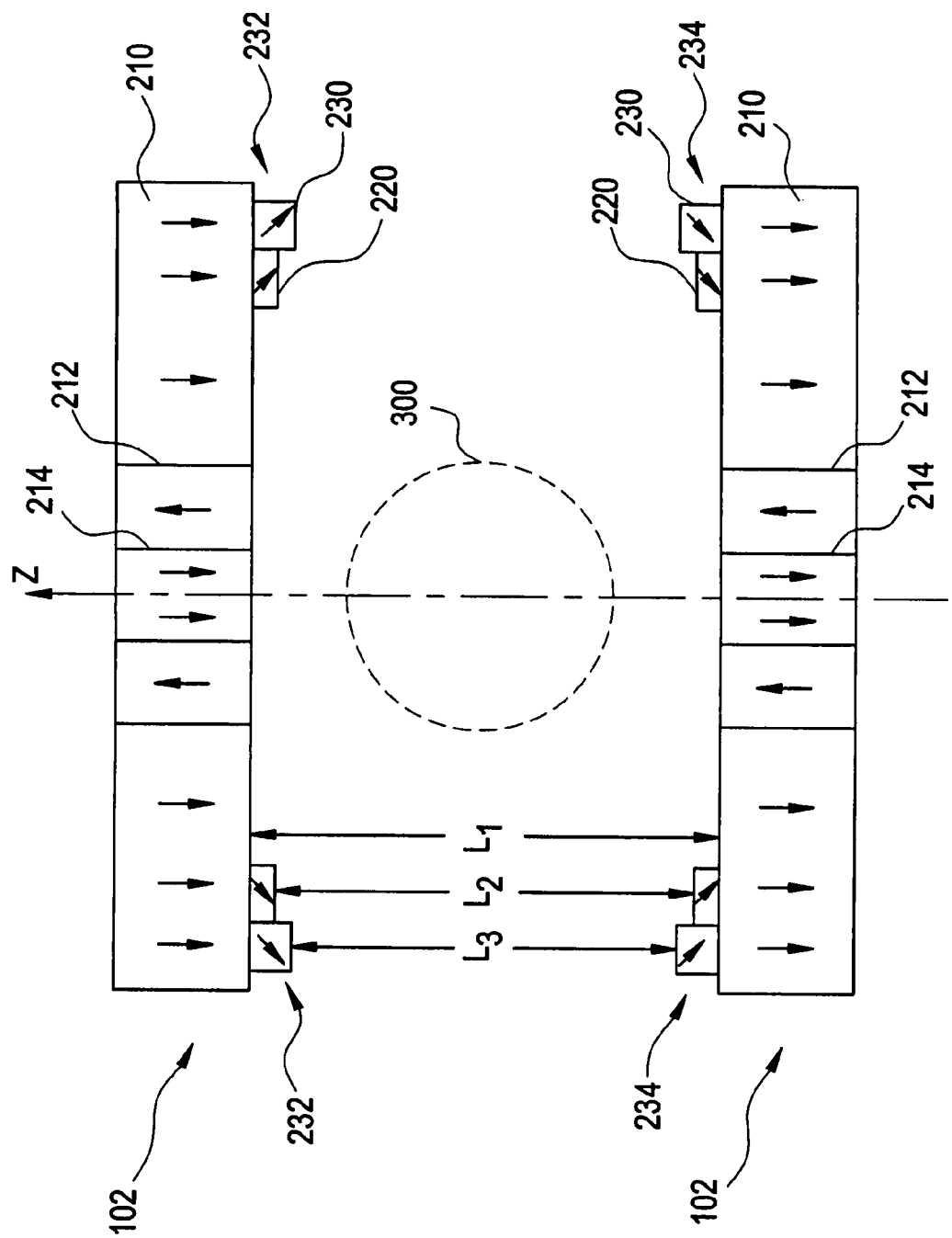
FIG. 4 shows a principal portion of the magnet apparatus.

A pair of the static field magnets 102 constructed as above are opposed to each other through a predetermined distance, as shown in FIG. 4. Given that the distance between permanent magnets 210 is L1, the distance between rings 220 is L2, and the distance between rings 230 is L3, there exists the relation of L1>L2>L3.

A magnetizing direction of the pair of permanent magnets 210 and magnetizing directions of the pairs of double rings 220 and 230 are indicated with arrows. The magnetizing direction of the permanent magnets 210 is the z direction. Magnetizing directions of the rings 220 and 230 are inclined directions relative to the z direction. The inclination of a first magnetizing direction 232 is an inclination which causes a magnetic flux entering and exiting from a magnetic pole to project away from the central axis of the magnet apparatus 100. This inclination will hereinafter be referred to as an outward inclination. The inclination of a second magnetizing direction 234 is an inclination which causes a magnetic flux entering and exiting from a magnetic pole to project towards the central axis of the magnet apparatus 100. This inclination will hereinafter be referred to as an inward inclination.

Figure 5:
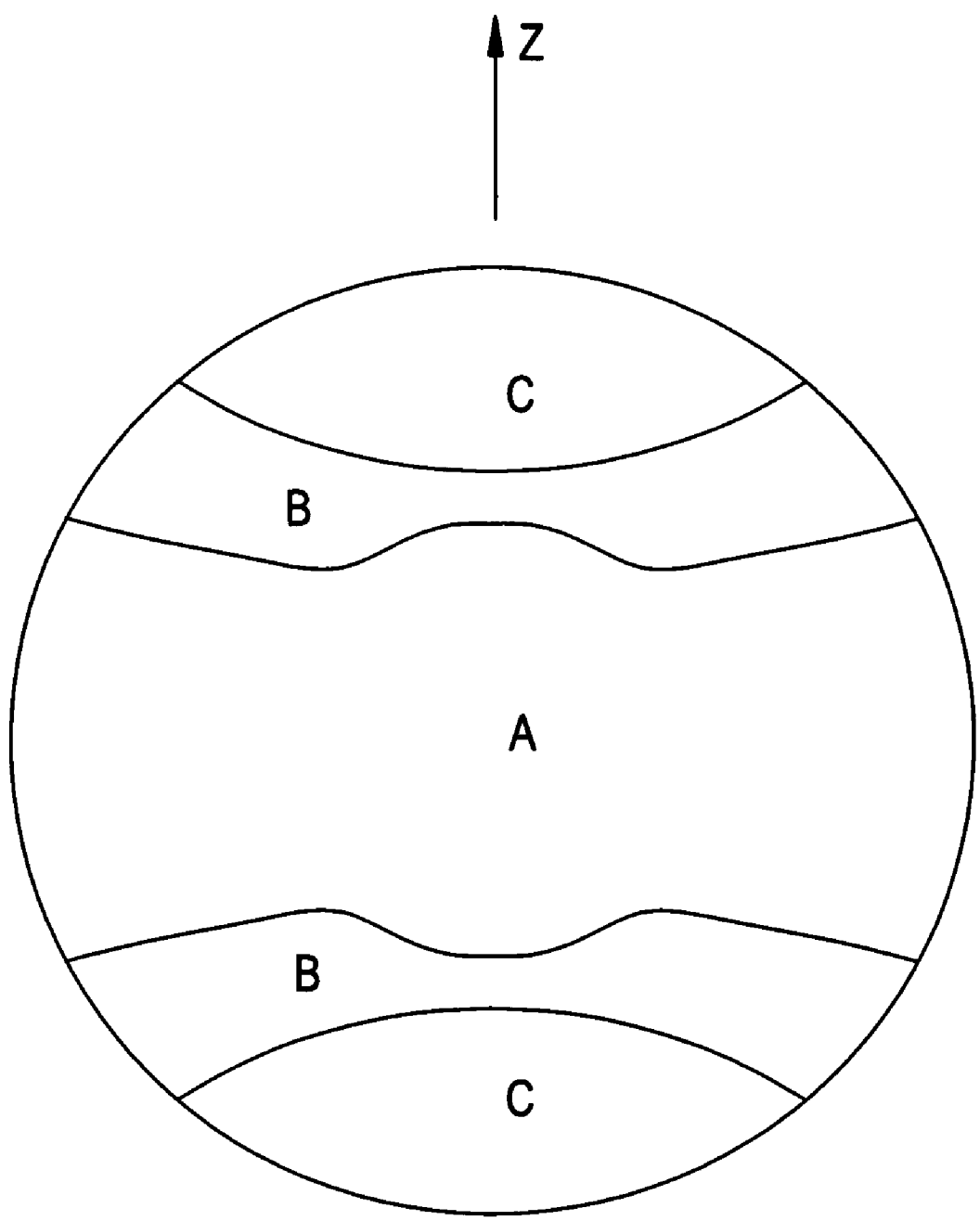
FIG. 5 shows partial regions in a photographing area.

A spherical or spheroidal area of a predetermined size formed centrally of the magnetic field space is a photographing area 300. With reference to FIG. 5, a description will now be given about a field strength distribution in the photographing area 300. FIG. 5 is a vertical sectional including the center of the photographing area 300. Three partial regions A, B and C are assumed in the photographing area 300. When the photographing area 300 is compared to the earth, the region A corresponds to a low latitude portion and the regions B and C correspond to a middle latitude portion and a high latitude portion, respectively.

The double rings 220 and 230 provided on the pole faces of the permanent magnets 210 are permanent magnets and therefore, by virtue of the resulting magnetic field strengthening effect, the field strength of the photographing area 300 becomes higher than in the prior art wherein pole pieces formed of soft iron or the like are provided on the pole faces of the permanent magnets 210.

As a result, the field strength of the area A becomes a field strength corresponding to a medium magnetic field of, for example, 0.45T or so. Further, since the magnetizing directions of the double rings 220 and 230 are inclined outwards, a sideways entry of a magnetic flux to the photographing area 300 does not occur unlike the case where pole pieces formed of soft iron or the like are provided on the pole faces of the permanent magnets 210.

Thus, the field strength distribution in the area A is highly uniform. Particularly, since the two pairs of rings 220 and 230 are opposed to each other in such a manner that the spacing between the outside rings 230 is smaller than the spacing between the inside rings 220, it is possible to not only enhance the field strength but also improve the uniformity of magnetic field.

The closer to the double rings 220 and 230, the more outstanding the magnetic field strengthening effect of the double rings 220 and 230. Therefore, if no measure is taken against this state, the field strength will increase in the order of A, B, and C, resulting in that the magnetic field in the photographing area 300 becomes non-uniform. In this connection, the field strength distribution is made uniform by the two cylinders 212 and 214 provided in each permanent magnet 210.

Since the cylinders 212 and 214 are formed using a ferromagnetic material, a local return magnetic path is formed within each permanent magnet 210. Since the magnetic flux passing through the local return magnetic path does not participate in the formation of magnetic field in the photographing area 300, the field strength so much decreases. By utilizing this phenomenon it is possible to suppress the increase of magnetic field in the regions B and C to about the same degree as that in the region A and thereby make the field strength distribution in the photographing area 300 uniform. The cylinder 212 mainly functions to make the field strength distribution in the region B uniform, while the cylinder 214 mainly functions to make the field strength distribution in the region C uniform.

In this way it is possible to attain an increase of field strength and uniforming of field strength distribution in the photographing area 300. In addition, the mechanical strength of each permanent magnet 210 can be increased by the cylinders 212 and 214 provided within the permanent magnet 210.

Figure 6:
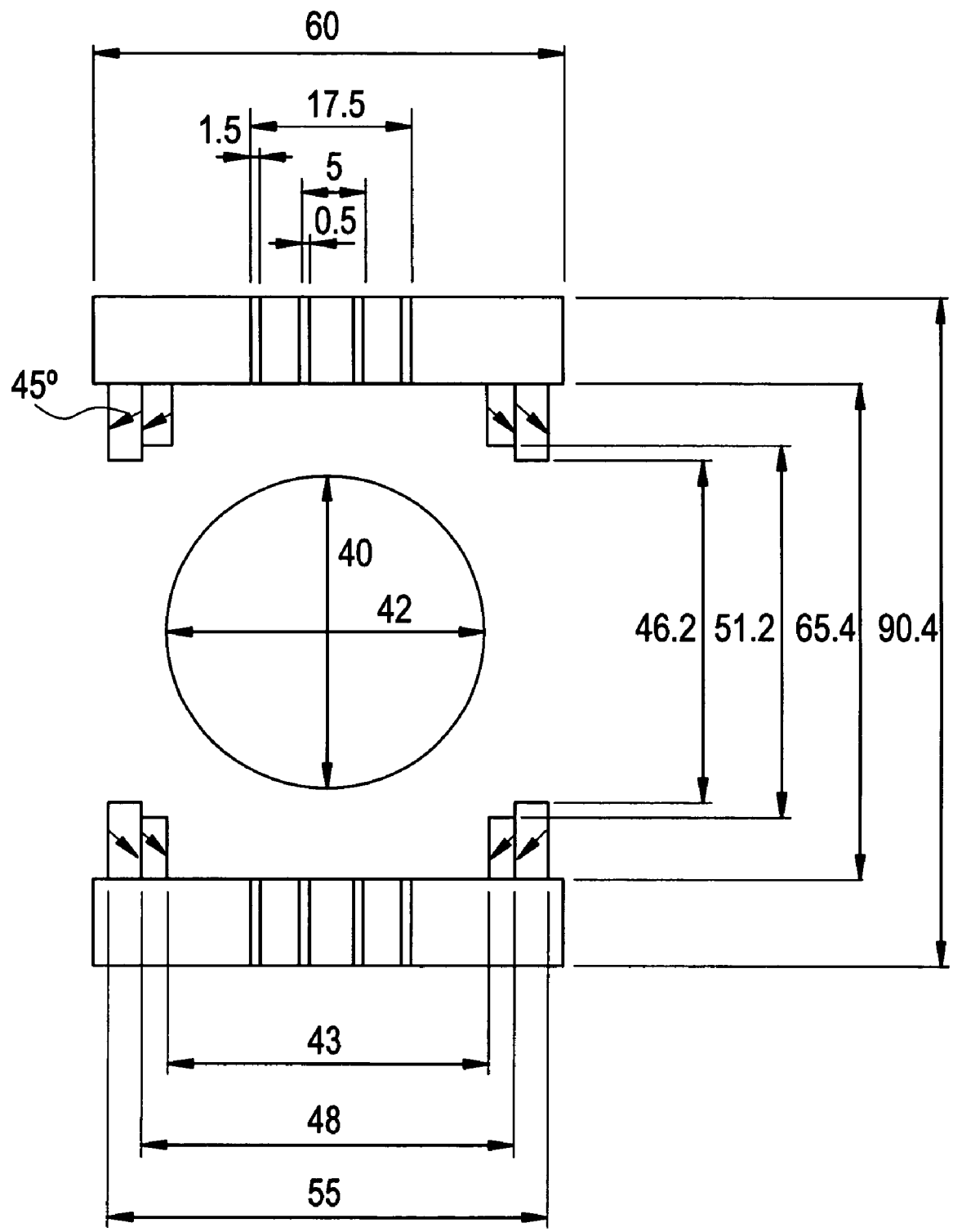
FIG. 6 shows concrete examples of sizes in the magnet apparatus.

Concrete numerical examples of sizes in the magnet apparatus constructed as above are shown in FIG. 6. The unit of length is cm. As to the two cylinders, the outside one is thicker than the inside one, whereby it is possible to effectively improve the uniformity of magnetic field and enhance the magnetic strength of the permanent magnet portion. Further, since the inside diameter of the inside one of the two rings is larger than the diameter of the photographing area and the outside diameter of the outside one of the two cylinders is smaller than the diameter of the photographing area, it is possible to improve the balance between the field strength and uniformity.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnet apparatus having a pair of parallel disc-like permanent magnets with magnetic poles of mutually opposite polarities opposed to each other through a spacing, comprising:

two pairs of rings constituted by permanent magnets and provided respectively on pole faces of the pair of permanent magnets coaxially and doubly, the two pairs of rings each having a magnetizing direction inclined relative to a magnetizing direction of the pair of permanent magnets and having magnetic poles of mutually opposite polarities opposed to each other through a spacing; and two pairs of cylinders formed by a ferromagnetic material and partitioning the interiors of the pair of permanent magnets respectively coaxially and doubly.

2. A magnet apparatus according to claim 1, wherein the inclination of the magnetizing direction of at least one of the two pairs of rings is an inclination which causes a magnetic flux to project in a direction away from a central axis.

3. A magnet apparatus according to claim 2, wherein the two pairs of rings are opposed to each other in such a manner that the rings positioned outside are spaced shorter than the rings positioned inside.

4. A magnet apparatus according to claim 1, wherein the two pairs of cylinders are formed in such a manner that the cylinders positioned outside are thicker than the cylinders positioned inside.

5. A magnet apparatus according to claim 1, wherein the two pairs of rings are formed in such a manner that the rings positioned inside are larger in inside diameter than the diameter of a photographing area, and the two pairs of cylinders are formed in such a manner that the cylinders positioned outside are smaller in outside diameter than the diameter of the photographing area.

6. An MRI apparatus which reconstructs an image on the basis of a magnetic resonance signal picked up through a magnet apparatus, the magnet apparatus having a pair of parallel disc-like permanent magnets with magnetic poles of mutually opposite polarities opposed to each other through a spacing and also having a gradient magnetic field coil and an RF coil, wherein the magnet apparatus comprises:

two pairs of rings constituted by permanent magnets and provided respectively on pole faces of the pair of permanent magnets coaxially and doubly, the two pairs of rings each having a magnetizing direction inclined relative to a magnetizing direction of the pair of permanent magnets and having magnetic poles of mutually opposite polarities opposed to each other through a spacing; and two pairs of cylinders formed by a ferromagnetic material and partitioning the interiors of the pair of permanent magnets respectively coaxially and doubly.

7. An MRI apparatus according to claim 6, wherein the inclination of the magnetization direction of at least one of the two pairs of rings is an inclination which causes a magnetic flux to project in a direction away from a central axis.

8. An MRI apparatus according to claim 6, wherein the two pairs of rings are opposed to each other in such a manner that the rings positioned outside are spaced shorter than the rings positioned inside.

9. An MRI apparatus according to claim 6, wherein the two pairs of cylinders are formed in such a manner than the cylinders positioned outside are thicker than the cylinders positioned inside.

10. An MRI apparatus according to claim 6, wherein the two pairs of rings are formed in such a manner that the rings positioned inside are larger in inside diameter than the diameter of a photographing area, and the two pairs of cylinders are formed in such a manner that the cylinders positioned outside are smaller in outside diameter than the diameter of the photographing area.

* * * * *